US010679718B2

(12) United States Patent
Ghaly et al.

(10) Patent No.: US 10,679,718 B2
(45) Date of Patent: Jun. 9, 2020

(54) ERROR REDUCING MATRIX GENERATION

(71) Applicant: Western Digital Technologies, Inc., San Jose, CA (US)

(72) Inventors: Mai Ghaly, Bloomington, MN (US); Chandan Mishra, Irvine, CA (US); Amir Hossein Gholamipour, Irvine, CA (US); Yuheng Zhang, Saratoga, CA (US); Jeffrey Koon Yee Lee, Milpitas, CA (US); James Hart, San Jose, CA (US); Daniel Helmick, Broomfield, CO (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 27 days.

(21) Appl. No.: 15/725,255

(22) Filed: Oct. 4, 2017

(65) Prior Publication Data

US 2019/0103168 A1    Apr. 4, 2019

(51) Int. Cl.
| | |
|---|---|
| *G11C 29/38* | (2006.01) |
| *G11C 29/36* | (2006.01) |
| *G11C 29/52* | (2006.01) |
| *G11C 29/44* | (2006.01) |
| *G11C 29/42* | (2006.01) |
| *G11C 29/00* | (2006.01) |
| *G11C 29/50* | (2006.01) |

(52) U.S. Cl.
CPC .............. *G11C 29/38* (2013.01); *G11C 29/36* (2013.01); *G11C 29/42* (2013.01); *G11C 29/4401* (2013.01); *G11C 29/52* (2013.01); *G11C 29/76* (2013.01); *G11C 2029/4402* (2013.01)

(58) Field of Classification Search
CPC ......... G11C 29/38; G11C 29/36; G11C 29/52; G11C 29/70; G11C 29/4401; G11C 29/76; G11C 2029/4402; G11C 29/42; H03M 13/11
See application file for complete search history.

(56) References Cited

U.S. PATENT DOCUMENTS

| | | | | |
|---|---|---|---|---|
| 5,243,604 | A * | 9/1993 | Tsang ................. | G11B 20/1833 714/764 |
| 6,747,930 | B1 * | 6/2004 | Weldon ................ | G06K 19/044 369/47.1 |
| 2002/0157051 | A1 * | 10/2002 | Eckelman ............. | G06F 11/263 714/736 |
| 2003/0023928 | A1 * | 1/2003 | Jedwab .................. | G11C 11/16 714/763 |
| 2003/0179605 | A1 * | 9/2003 | Riesenman ............ | G06F 12/04 365/189.15 |
| 2005/0138537 | A1 * | 6/2005 | Worley ............... | H03M 13/095 714/801 |

(Continued)

*Primary Examiner* — April Y Blair
*Assistant Examiner* — Dipakkumar B Gandhi
(74) *Attorney, Agent, or Firm* — Kunzler Bean & Adamson, PC

(57) ABSTRACT

Apparatuses, systems, methods, and computer program products are disclosed for error reducing matrix generation. An apparatus includes a test circuit that performs a test on a set of memory cells. An apparatus includes a masking circuit that determines a masking array based on a test performed on a set of memory cells. An apparatus includes a decoding circuit that decodes encoded data from a set of memory cells based on a masking array.

17 Claims, 8 Drawing Sheets

(56) References Cited

U.S. PATENT DOCUMENTS

| | | | |
|---|---|---|---|
| 2007/0130496 A1* | 6/2007 | Kanno | G06F 11/1072 |
| | | | 714/763 |
| 2008/0282120 A1* | 11/2008 | Liao | G06F 11/1008 |
| | | | 714/719 |
| 2012/0173921 A1* | 7/2012 | Wuu | G11C 29/44 |
| | | | 714/6.21 |
| 2012/0198312 A1* | 8/2012 | Kankani | G06F 11/1012 |
| | | | 714/768 |
| 2013/0061006 A1* | 3/2013 | Hein | G06F 13/4243 |
| | | | 711/154 |
| 2013/0080862 A1* | 3/2013 | Bennett | G06F 11/1076 |
| | | | 714/782 |
| 2013/0232386 A1* | 9/2013 | Shore | G11C 29/883 |
| | | | 714/719 |
| 2014/0126293 A1* | 5/2014 | Tsai | G11C 29/808 |
| | | | 365/185.18 |
| 2015/0287478 A1* | 10/2015 | Chen | G11C 29/26 |
| | | | 714/719 |
| 2016/0004587 A1* | 1/2016 | Agrawal | G11C 29/52 |
| | | | 714/6.11 |
| 2017/0337106 A1* | 11/2017 | Yen | G11C 29/021 |
| 2018/0287632 A1* | 10/2018 | Rom | H03M 13/11 |

* cited by examiner

ERROR REDUCING MATRIX GENERATION

TECHNICAL FIELD

The present disclosure, in various embodiments, relates to reducing errors in memory and more particularly relates to generating an error reducing matrix.

BACKGROUND

Many electrical circuits and devices, such as data storage devices or the like, include error correcting code (ECC) features to increase error recovery robustness. Too many errors may reduce the effectiveness of ECC. For example, in some configurations, a decoder may not be able to decode data, even using ECC, if a number of errors exceed a threshold.

SUMMARY

Apparatuses are presented for error reducing matrix generation. In one embodiment, an apparatus includes a test circuit that performs a test on a set of memory cells. An apparatus, in certain embodiments, includes a masking circuit that determines a masking array based on a test performed on a set of memory cells. An apparatus, in one embodiment, includes a decoding circuit that decodes encoded data from a set of memory cells based on a masking array.

Systems are presented for error reducing matrix generation. A system, in one embodiment, includes a controller. In various embodiments, a system includes an array of storage locations. In some embodiments, a controller, in response to a failure to decode undecoded data stored on an array of storage locations, is configured to write test data to each storage location of an array of storage locations. In a further embodiment, a controller is configured to read test data stored on each storage location of an array of storage locations. In certain embodiments, a controller is configured to compare test data written to each storage location with test data read from each storage location. In various embodiments, a controller is configured to form an error location matrix based on a comparison between test data written to each storage location and test data read from each storage location.

An apparatus for error reducing matrix generation, in one embodiment, includes means for testing operation of a memory block in response to a failure to decode data of the memory block during a decoding operation. In some embodiments, an apparatus includes means for determining portions of a memory block that caused a failure to decode data of the memory block during a decoding operation.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
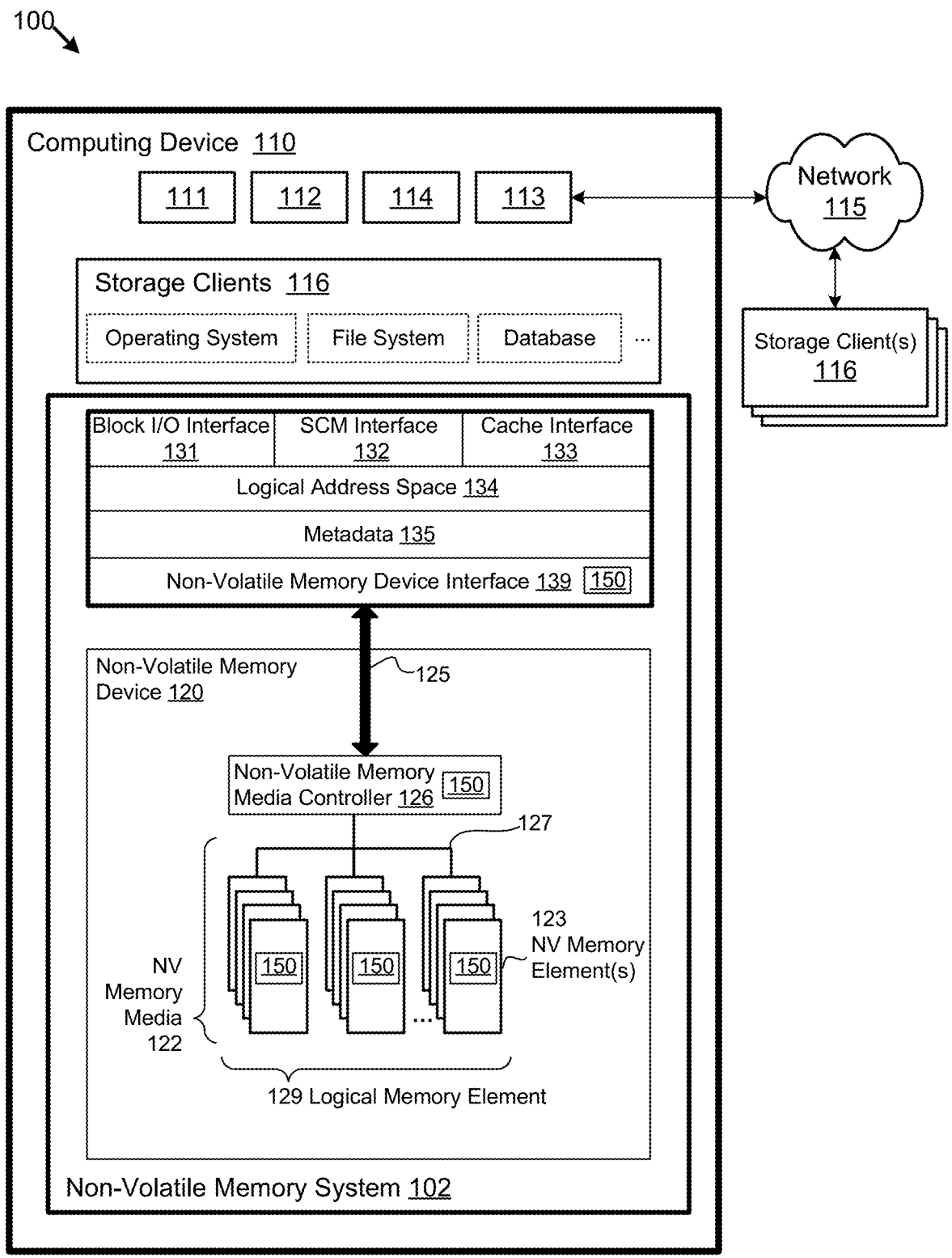
FIG. 1A is a schematic block diagram illustrating one embodiment of a system for error reducing matrix generation.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer, internal to a device, or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 comprising an error correction component 150 for a non-volatile memory device 120. The error correction component 150 may be part of and/or in communication with a non-volatile memory media controller 126, a non-volatile memory medium 122, a non-volatile memory element 123, a device driver, or the like. As used herein, a device driver may refer to software code, a host processor, a device processor or controller, firmware, a hardware device, or the like. The error correction component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a Serial Advanced Technology Attachment (SATA) bus, a Parallel Advanced Technology Attachment (PATA) bus, a Small Computer System Interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the error correction component 150 may be embodied as one or more computer readable instructions stored on the non-transitory storage medium 114.

The non-volatile memory system 102, in the depicted embodiment, includes an error correction component 150. The error correction component 150, in one embodiment, is configured to perform a test on a set of memory cells for the non-volatile memory device 120 described below. The error correction component 150, in certain embodiments, may determine a masking array based on a test performed on a set of memory cells. The error correction component 150 may also decode encoded (e.g., undecoded) data from a set of memory cells based on a masking array. Thus, an ability to decode data from a set of memory cells may be increased.

In one embodiment, the error correction component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the error correction component 150 may comprise executable software code, such as a device driver or the like, stored on the computer readable storage medium 114 for execution on the processor 111. In a further embodiment, the error correction component 150 may include a combination of both executable software code and logic hardware.

In one embodiment, the error correction component 150 is configured to receive storage requests from a device driver or other executable application via a bus 125 or the like. The error correction component 150 may be further configured to transfer data to/from a device driver and/or storage clients 116 via the bus 125. Accordingly, the error correction component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the error correction component 150 may receive storage requests as an API call from a storage client 116, as an IO-CTL command, or the like.

According to various embodiments, a non-volatile memory controller 126 in communication with one or more error correction components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a cache line address, a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. In certain embodiments, a device driver may be included in the non-volatile memory media controller 126, the non-volatile memory media 122, and/or the non-volatile memory elements 150. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, toggle mode, Open NAND Flash Interface (ONFI), Burst Mode, DDR4, DDR4LP, NVDIMM-P, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory; 3D NAND flash memory; SLC, MLC, TLC, and/or QLC; or the like), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like.

While legacy technologies such as NAND flash may be block and/or page addressable, storage class memory (SCM), in one embodiment, is byte addressable. In further embodiments, storage class memory may be faster and/or have a longer life (e.g., endurance) than NAND flash; may have a lower cost, use less power, and/or have a higher storage density than DRAM; may be write-in-place (e.g., allowing data to be programmed over existing data, without first performing an erase operation or the like); or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof. In some embodiments, the non-volatile memory device 120 may comprise non-SCM and/or non-program in place memory. In such embodiments, a NAND device may read an entire block into RAM, erase the entire block, program the entire block, read the entire block, and/or compare the entire block.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. In various embodiments, the bus 127 may communicatively couple the non-volatile memory elements 123 to the non-volatile memory media controller 126 via serial communication lines. In certain embodiments, the bus 127 may include shared data and command lines. In some embodiments, the bus 127 may be used to communicate various command and data packet sizes (e.g., 8B, 256B, 96 kB, etc.). In various embodiments, the bus 127 may be used to communicate a physical layer, a link layer, and/or a transport layer. In certain embodiments, the bus 127 may be used to communicate proprietary communications. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above. The bus 125 may include one or more channels for addressing and/or commanding one or more non-volatile memory devices 120 individually and/or in parallel.

Figure 1B:
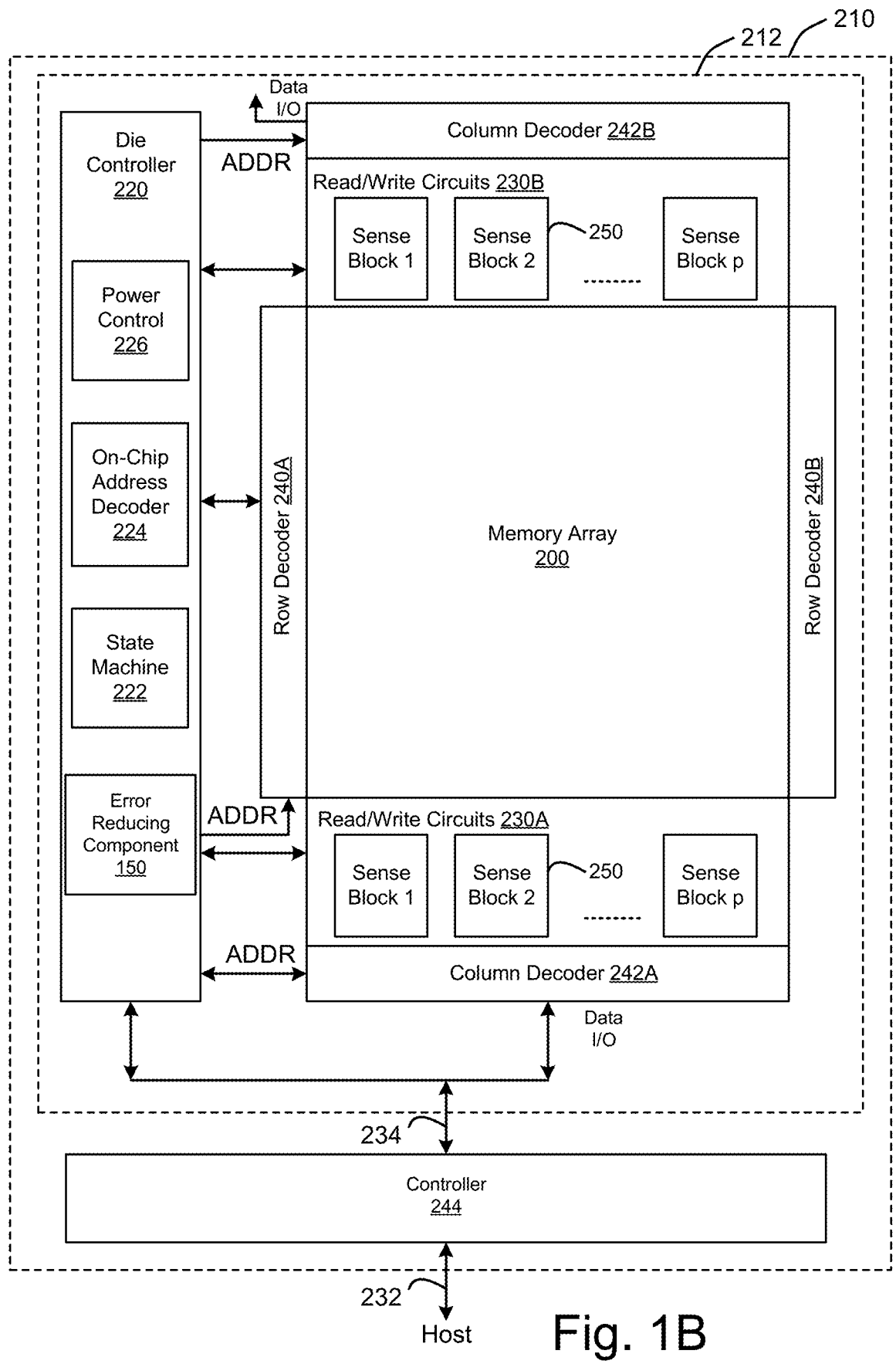
FIG. 1B is a schematic block diagram illustrating another embodiment of a system for error reducing matrix generation.

FIG. 1B illustrates an embodiment of a non-volatile storage device 210 that may include one or more memory die or chips 212. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In certain embodiments, the memory array 200 may be addressable in partitions, sub-arrays, ranks, banks, and/or groups. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes an error correction component 150, a state machine 222, and an on-chip address decoder 224. In one embodiment, the state machine 222 comprises at least a portion of the error correction component 150. In a further embodiment, the controller 244 comprises at least a portion of the error correction component 150. In various embodiments, one or more of the sense blocks 250 comprises at least a portion of the error correction component 150.

The error correction component 150, in one embodiment, in response to a failure to decode encoded/undecoded data stored on an array of storage locations, is configured to write test data to each memory device of the array of storage locations, read the test data stored on each memory device of the array of storage locations, compare the test data written to each memory device with the test data read from each memory device, and form an error location matrix based on the comparison between the test data written to each memory device and the test data read from each memory device.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In certain embodiments, the state machine 222 includes an embodiment of the error correction component 150. The error correction component 150, in certain embodiments, is embodied as software in a device driver, hardware in a device controller 244, and/or hardware in a die controller 220 and/or state machine 222.

In one embodiment, one or any combination of die controller 220, error correction component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
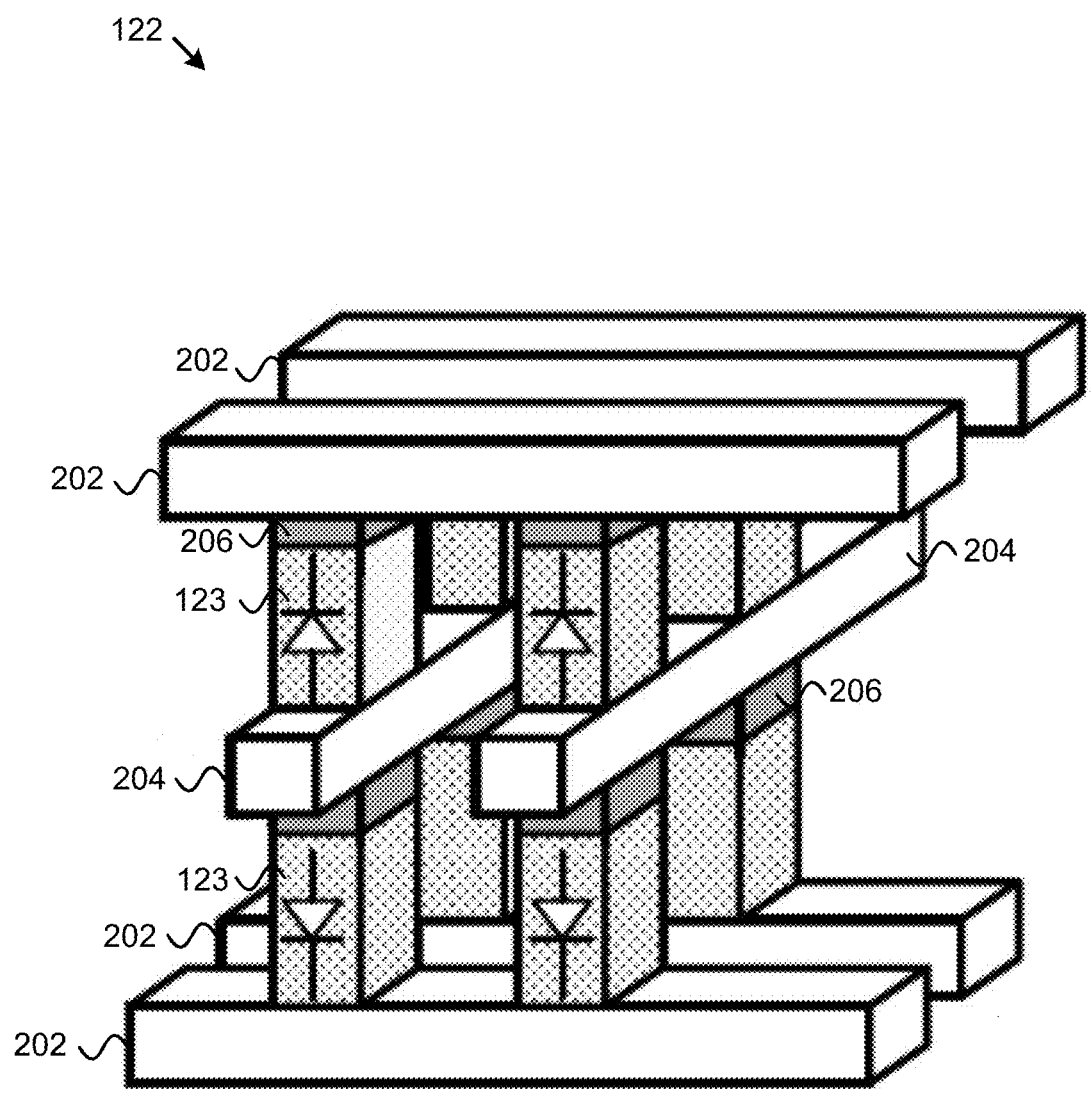
FIG. 2 is a schematic block diagram illustrating one embodiment of a non-volatile memory media for error reducing matrix generation.

FIG. 2 depicts one embodiment of a non-volatile memory media 122. The non-volatile memory media 122 may be any suitable type of non-volatile memory. In the illustrated embodiment, the non-volatile memory media 122 includes non-volatile memory elements 123 accessed using wordlines 202 and bitlines 204. Furthermore, switching layers 206 may facilitate accessing the non-volatile memory elements 123.

Figure 3:
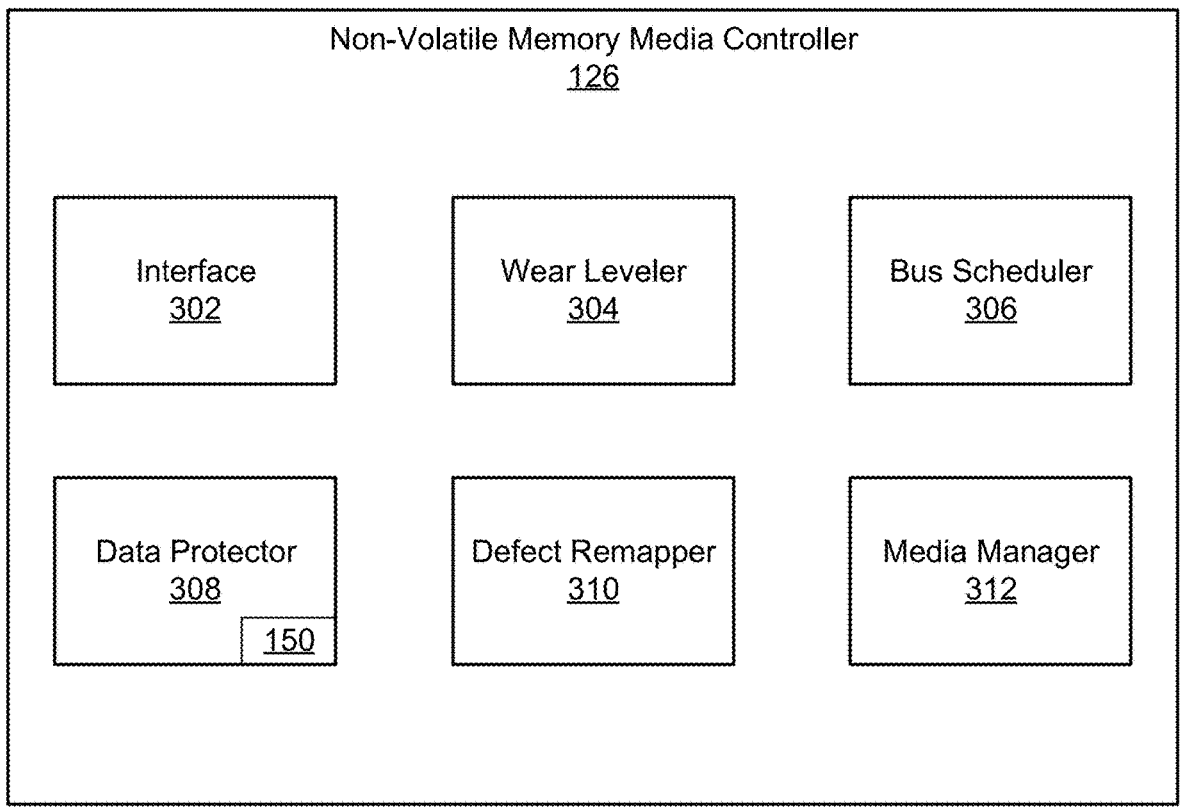
FIG. 3 is a schematic block diagram illustrating one embodiment of a non-volatile memory media controller for error reducing matrix generation.

FIG. 3 depicts one embodiment of a non-volatile memory media controller 126. In general, the non-volatile memory media controller 126 receives requests to access the non-volatile memory media 122 from the non-volatile memory device interface 139, sends the requests to the non-volatile memory media 122, and provides responses back to the non-volatile memory device interface 139. In one embodiment, the non-volatile memory media controller 126 may take the form of a non-volatile (e.g., flash) memory controller that may format the non-volatile memory to ensure the memory is operating properly, map out bad non-volatile memory cells, and allocate spare cells to be substituted for future failed cells. Some part of the spare cells may be used to hold firmware to operate the non-volatile memory media controller 126 and implement other features. In operation, when the computing device 110 needs to read data from or write data to the non-volatile memory media 122, it will communicate with the non-volatile memory media controller 126. If the computing device 110 provides a logical address to which data is to be read and/or written, the non-volatile memory media controller 126 may convert the logical address received from the computing device 110 to a physical address in the non-volatile memory media 122. (Alternatively, the computing device 110 may provide the physical address.) The non-volatile memory media controller 126 may also perform various operations having an undetermined duration from the computing device's perspective, such as, but not limited to, wear leveling (e.g., distributing writes to avoid wearing out specific blocks of memory that would otherwise be repeatedly written to) and/or garbage collection (e.g., after a block is full, moving only the valid pages of data to a new block, so the full block can be erased and reused). In the depicted embodiment, the non-volatile memory media controller 126 includes an interface 302, a wear leveler 304, a bus scheduler 306, a data protector 308, a defect remapper 310, and a media manager 312 to perform various functions.

The interface 302 may facilitate communication between the non-volatile memory media controller 126 and another device, such as the non-volatile memory device interface 139. Furthermore, the interface 302 may facilitate front end command handling. In certain embodiments, the interface 302 may include a cache and/or a buffer (e.g., read cache, write buffer, etc.). In some embodiments, the interface 302 may include a write buffer that may be used for auto-confirms. In various embodiments, the interface 302 may facilitate outputting ordered commands via first-in first-out (FIFO). In certain embodiments, the interface 302 may be used for read cache insertion.

The wear leveler 304 may move data periodically to distribute wear of non-volatile memory media 122. In certain embodiments, the wear leveler 304 may be used to decode a present location of data due to wear leveling. The bus scheduler 306 may be used for command scheduling, prioritization and/or execution. In some embodiments, the bus scheduler 306 may be used to check cached programs during operations.

The data protector 308 may perform decoding operations, encoding operations, scrambling operations, descrambling operations, Error Correcting Code (ECC) operations, Error Detection Code (EDC) operations, and/or parity operations. In some embodiments, the data protector 308 may include one embodiment of the error correction component 150. The error correction component 150 may be substantially similar to the error correction component 150 described above with regard to FIGS. 1A, 1B, 4, and/or 5. The functions of the error correction component 150 may be performed in the non-volatile memory media controller 126 (e.g., by commanding actions from the non-volatile memory media controller 126, pulling data to the non-volatile memory media controller 126, doing the functions at the non-volatile memory media controller 126), in the non-volatile memory media 122 (e.g., using walked through commands from the non-volatile memory media controller 126), or using a shared relationship between the non-volatile memory media controller 126 and the non-volatile memory media 122. The defect remapper 310 may perform defect remapping to disperse spare capacity of the non-volatile memory media 122. The media manager 312 may manage media such as by performing background retention and/or disturb monitoring.

Figure 4:
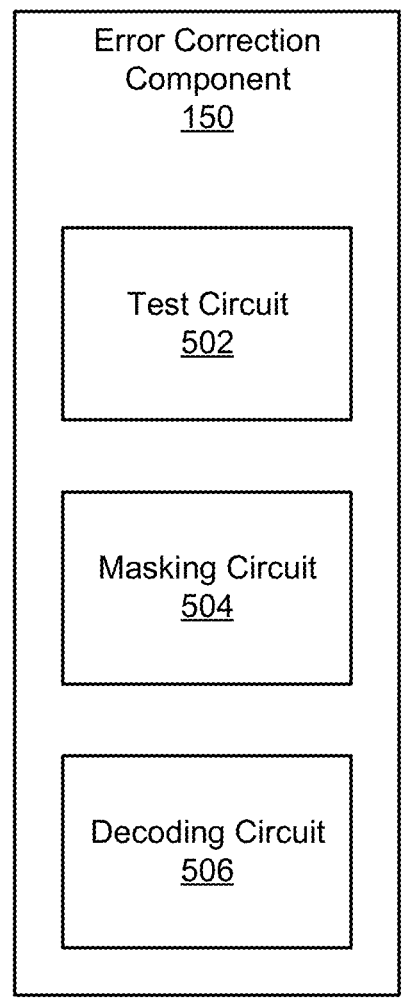
FIG. 4 is a schematic block diagram illustrating one embodiment of an error correction component.

FIG. 4 depicts one embodiment of an error correction component 150. The error correction component 150 may be substantially similar to the error correction component 150 described above with regard to FIGS. 1A and/or 1B. In general, as described above, the error correction component 150 performs a test on a set of memory cells, determines a masking array based on the test performed on the set of memory cells, and decodes encoded/undecoded data from the set of memory cells based on the masking array. Accordingly, the error correction component 150 may facilitate decoding encoded/undecoded data that fails a decoding operation. In the depicted embodiment, the error correction component 150 includes a test circuit 502, a masking circuit 504, and a decoding circuit 506.

In one embodiment, the test circuit 502 performs a test on a set of memory cells (e.g., an array of storage locations). In certain embodiments, the test circuit 502 may perform the test in response to a failure to decode encoded/undecoded data stored on the set of memory cells. The test may be used to determine whether memory cells and/or circuitry corresponding to memory cells contain defects. In some embodiments, the test may include a write-in-place operation. In certain embodiments, the test may include a read operation, a program operation, a write operation, and/or a verify operation.

In various embodiments, performing the test may include: performing a write operation on a set of memory cells to write test data to each memory cell (e.g., storage location) of the set of memory cells; performing a read operation on each memory cell of the set of memory cells to obtain test result data; and indicating an error for each memory cell of the set of memory cells in which the test data written to the memory cell does not match the test result data for the memory cell. In one embodiment, the test may include: writing test data to each memory cell of a set of memory cells; reading the test data stored on (e.g., written to) each memory cell of the set of memory cells; and comparing the test data written to each memory cell with the test data read from each memory cell. In some embodiments, the test data may be a predetermined test data pattern and/or the data read from the set of memory cells.

For example, in one embodiment, the test data may comprise user data (e.g., data from a storage client 116, from a host computing device 110, or the like previously stored in the memory array 200) which the test circuit 502 may read from a set of memory cells and either compare to the originally written data (e.g., still stored in a write buffer or the like), an inverse of the user data, or other data, or may re-write to the same set of memory cells (e.g., for write-in-place media such as ReRAM, PCM, MRAM, or other storage class memory), and re-read the re-written data to compare it to the originally read data. In this manner, for write-in-place media, in certain embodiments, the test circuit 502 may perform a test on a set of memory cells storing user data, with little or no effect on the stored user data, without requiring the overhead of additional memory cells for relocating the stored data, or the like. In other embodiments, for write-once media such as NAND flash or the like, the test circuit 502 may relocate data, may use a predefined test data pattern for test data, or the like.

In certain embodiments, the masking circuit 504 determines a masking array based on a test performed on a set of memory cells. In various embodiments, the masking array (e.g., error location matrix) is formed based on an error indication for each memory cell of the set of memory cells in which the test data written to the memory cell does not match the test result data for the memory cell. In some embodiments, the masking array may be stored in a buffer, such as an error register. The masking array may indicate locations of errors in the set of memory cells based on a comparison between test data written to the set of memory cells and data read from the set of memory cells. In certain embodiments, the masking array may indicate locations having errors with a "1" flag and locations without errors with a "0" flag. In other embodiments, the masking array may indicate locations having errors with a "0" flag and locations without errors with a "1" flag. In some embodiments, such as embodiments in which a decoder supports hardwired erasure pointers, the masking array may be used to form wired erasure pointers that indicate to the decoding circuit 506 a likelihood of erroneous data. For example, in one embodiment, the masking array is provided to the decoding circuit 506 and the decoding circuit 506 forms wired erasure pointers internally based on the masking array. As used herein erasure pointers may be used to indicate data locations that are erased, ignored, and/or unused during decoding. In various embodiments, the masking array may serve as an erasure mask of bad bits. In certain embodiments, the masking circuit 504 uses the masking array to mask encoded/undecoded data resulting in masked encoded/undecoded data. For example, in various embodiments, the masking array masks the encoded/undecoded data by using a logic function to set bits corresponding to the masking array to a same logic value (e.g., a logic high, a logic low, a "1", a "0"). The logic function may be any suitable logic function (or operation), such as an AND function, an OR function, a NOR function, and/or an exclusive or (XOR) function. In one embodiment, the logic function may include an XOR operation performed between the masking array and encoded/undecoded data. In such an embodiment, a result of the XOR operation may be provided to the decoding circuit 506 for decoding. In some embodiments, the masking array includes a software indication of locations of errors in the set of memory cells. In certain embodiments, the masking array may be used to identify bits stuck at a logic value (e.g., bits stuck at "0" or bits stuck at "1") and the masking array may indicate different handling choices based on the logic value of the stuck bits. The different handling choices may include applying different voltages to drive the stuck bits harder, remapping, applying aging logic (e.g., bits stuck at "0" may have a threshold for remapping at 5%, bits stuck at "1" may have a threshold for remapping at 10%), or the like.

In some embodiments, the decoding circuit 506 decodes encoded/undecoded data from the set of memory cells based on the masking array. For example, the decoding circuit 506 may decode encoded/undecoded data read from the set of memory cells after performing an XOR operation using the encoded/undecoded data and the masking array. As another example, the decoding circuit 506 may decode encoded/undecoded data read from the set of memory cells using erasure pointers and the encoded/undecoded data as inputs. In certain embodiments, performance of a decoding operation may be initiated based on the masking array. For example, performance of the decoding operation may be initiated in response to the masking array indicating a number of errors greater than a minimum threshold and/or less than a maximum threshold. As another example, performance of the decoding operation may be initiated in response to the masking array indicating a number of errors greater than or equal to a minimum threshold and/or less than or equal to a maximum threshold. In some embodiments, in response to the number of errors indicated by the masking array being greater than the maximum threshold, the error correction component 150 may use a redundant array of independent disks (RAID) device for recovery of the encoded/undecoded data. In such embodiments, the set of memory cells corresponding to the masking array may be marked and/or indicated as being unusable. Moreover, the set of memory cells may be marked for data auto relocation. In various embodiments, in response to the number of errors indicated by the masking array being less than the minimum threshold and/or in response to the decoding circuit 506 being unsuccessful at decoding the encoded/undecoded data from the set of memory cells based on the masking array, the error correction component 150 may use a RAID device for recovery of the encoded/undecoded data. In such embodiments, if the number of errors is less than or equal to eight (as an example), a refresh in place may be performed. If the number of errors is greater than eight, the set of memory cells corresponding to the masking array may be marked and/or indicated as being unusable. Moreover, the set of memory cells may be marked for data auto relocation. As may be appreciated, in embodiments that use the error correction component 150, decoding capability may be improved such that a larger number of encoded/undecoded data (e.g., improved by 2 orders, improved by 3 orders, improved by 4 or more orders, twice the number of errors corrected) is decoded than embodiments that do not use the error correction component 150.

Figure 5:
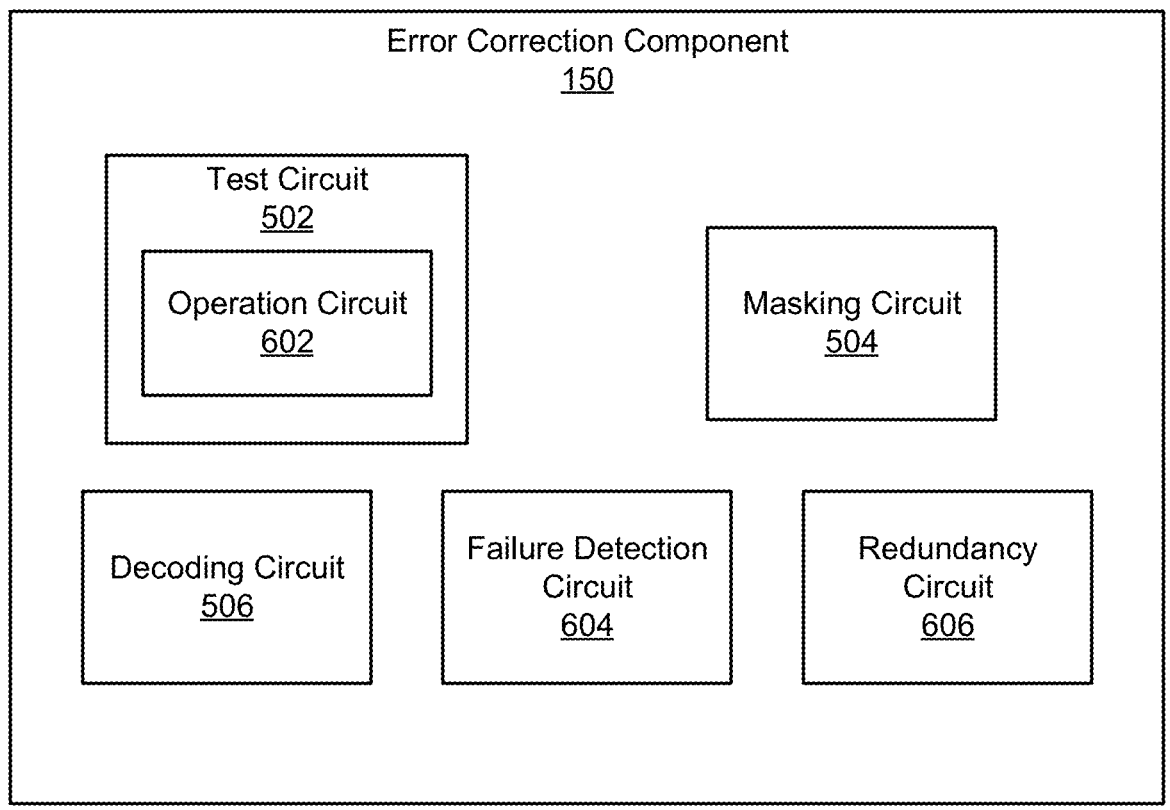
FIG. 5 is a schematic block diagram illustrating a further embodiment of an error correction component.

Turning to FIG. 5, a further embodiment of an error correction component 150 is illustrated. The error correction component 150 may be substantially similar to the error correction component 150 described above with regard to FIGS. 1A, 1B, 2, 3, and/or 4. In the depicted embodiment, the error correction component 150 includes the test circuit 502, the masking circuit 504, and the decoding circuit 506 and further includes an operation circuit 602, a failure detection circuit 604, and a redundancy circuit 606. The test circuit 502, the masking circuit 504, and the decoding circuit 506 may be substantially as described above with regard to FIG. 4.

In one embodiment, the operation circuit 602 is used to perform an operation (e.g., as part of a test) in response to a failure to decode encoded/undecoded data stored on a set of memory cells. In some embodiments, the operation circuit 602 may be used to perform a read operation, a program operation, a write operation, and/or a verify operation. In certain embodiments, the operation circuit 602 may perform a write-in-place operation.

In certain embodiments, the failure detection circuit 604 is used to detect a failure of a decoding operation used to decode encoded/undecoded data stored in a set of memory cells. For example, in one embodiment, the failure detection circuit 604 includes a Bose-Chaudhuri-Hocquenghem (BCH) decoder, Low Density Parity Check (LDPC), or another ECC decoder failing to decode encoded/undecoded data in an ECC correction operation or EDC check such as Cyclical Redundancy Check (CRC) or Logical Address (LA) mismatch. In certain embodiments, the test circuit 502 performs a test on the set of memory cells in response to the failure detection circuit 604 detecting the failure. In some embodiments, the test circuit 502 may perform the test in a test mode. In various embodiments, in response to the failure of the decoding operation, the encoded/undecoded data may be stored in a buffer and/or register for further attempts at decoding.

In various embodiments, the redundancy circuit 606 is used to compare a number of error bits indicated by the masking array to a minimum threshold and/or a maximum threshold. In certain embodiments, the redundancy circuit 606 accesses a redundancy storage in response to the number of error bits being greater than the maximum threshold and/or less than the minimum threshold.

Figure 6:
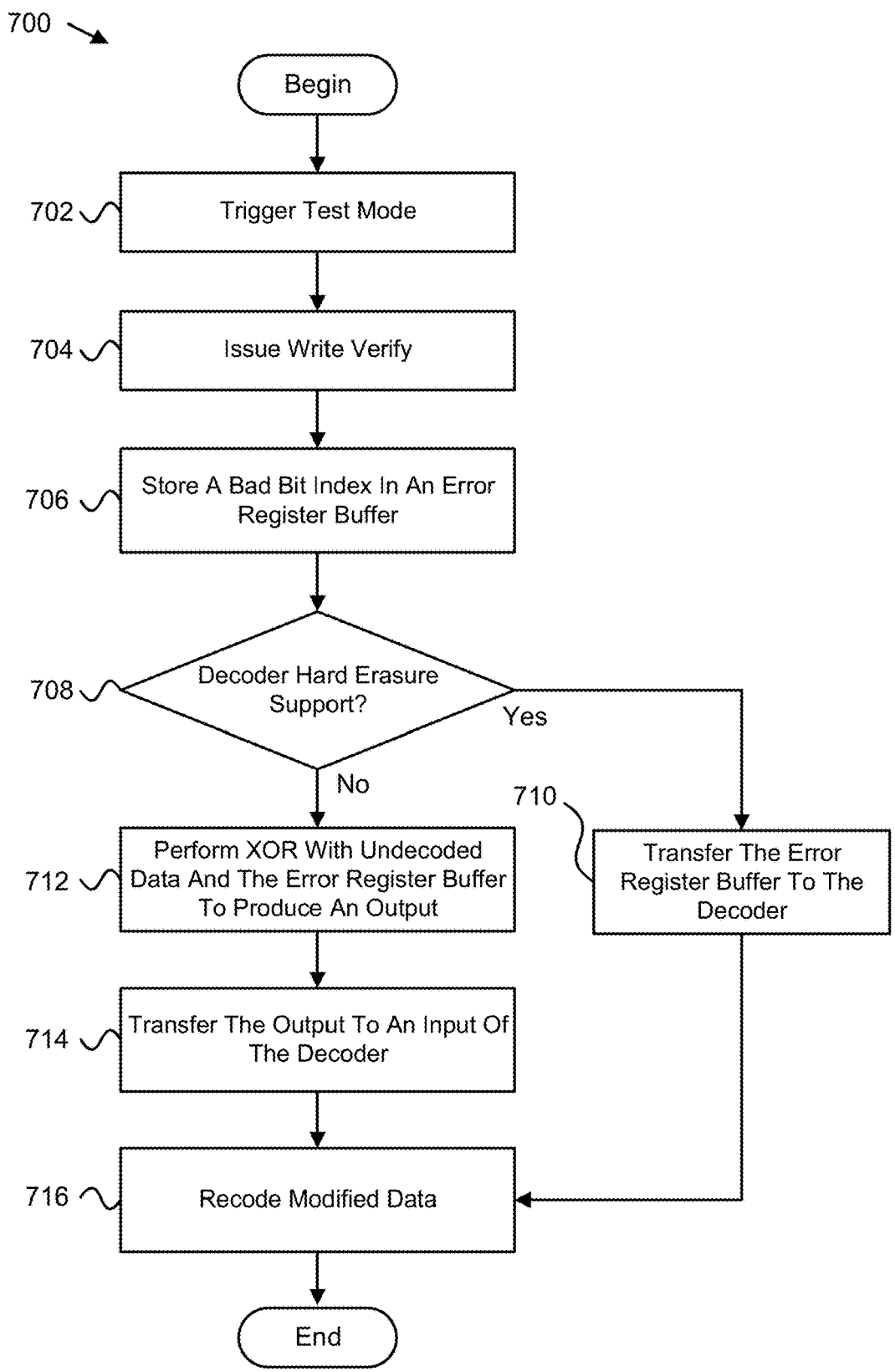
FIG. 6 is a schematic flow chart diagram illustrating one embodiment of a method for error reducing matrix generation.

FIG. 6 depicts one embodiment of a method 700 for error reducing matrix generation. The method 700 begins and the failure detection circuit 604 triggers 702 initiation of a test mode in response to a failure to decode encoded/undecoded data stored in a set of memory cells. The test circuit 502 issues 704 a write verify on the set of memory cells to determine which memory cells of the set of memory cells are not able to successfully read back data written to the memory cells. In some embodiments, the test circuit 502 may send data to a non-volatile memory media 122, program (e.g., write) the data to the non-volatile memory media 122, read the data from the non-volatile memory media 122, transfer the read data to the non-volatile memory media controller 126, and compare the read data to the sent data (e.g., verify). The masking circuit 504 stores 706 a bad bit index in an error register buffer that indicates the memory cells that are not able to successfully read back data written to the memory cells. Moreover, the decoding circuit 506 determines 708 whether a decoder has hard erasure support. In response to the decoding circuit 506 determining 708 that the decoder has hard erasure support, the decoding circuit 506 transfers 710 the error register buffer to the decoder. In response to the decoding circuit 506 determining 708 that the decoder does not have hard erasure support, the decoding circuit 506 performs 712 an exclusive or (XOR) between the encoded/undecoded data and the error register buffer to produce an output. The decoding circuit 506 transfers 714 the output to an input of the decoder. The decoder may be used to decode the encoded/undecoded data. The decoding circuit 506 may recode 716 modified data, and the method 700 ends.

Figure 7:
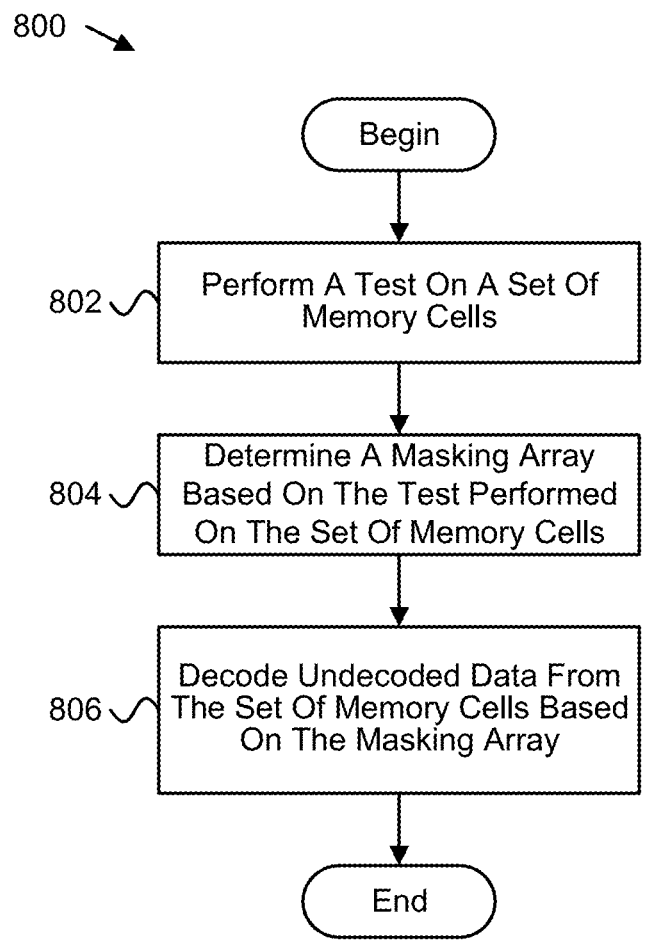
FIG. 7 is a schematic flow chart diagram illustrating a further embodiment of a method for error reducing matrix generation.

FIG. 7 is a schematic flow chart diagram illustrating a further embodiment of a method 800 for error reducing matrix generation. The method 800 begins, and the test circuit 502 performs 802 a test on a set of memory cells. Moreover, the masking circuit 504 determines 804 a masking array based on the test performed on the set of memory cells. The decoding circuit 506 decodes 806 encoded/undecoded data from the set of memory cells based on the masking array, and the method 800 ends. By using the method 800, encoded/undecoded data may be decoded, such as in configurations in which a first attempt at decoding the encoded/undecoded data failed.

A means for testing operation of a memory block in response to a failure to decode data of the memory block during a decoding operation, in various embodiments, may include one or more of an error correction component 150, a testing circuit 502, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for testing operation of a memory block in response to a failure to decode data of the memory block during a decoding operation.

A means for determining portions of the memory block that caused the failure to decode the data of the memory block during the decoding operation, in certain embodiments, may include one or more of an error correction component 150, a masking circuit 504, a decoding circuit 506, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for determining portions of the memory block that caused the failure to decode the data of the memory block during the decoding operation.

A means for decoding the data of the memory block by masking the determined portions of the memory block that caused the failure, in some embodiments, may include one or more of an error correction component 150, a masking circuit 504, a decoding circuit 506, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for decoding the data of the memory block by masking the determined portions of the memory block that caused the failure.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
a failure detection circuit that detects a failure of a decoding operation used to decode encoded data stored in a set of memory cells;
a test circuit that performs a test on the set of memory cells in response to the failure detection circuit detecting the failure;
a masking circuit that determines a masking array based on the test performed on the set of memory cells, wherein the masking array comprises an error location matrix determined based on the test performed on the set of memory cells, the error location matrix indicates memory cells in the set of memory cells having errors, and the error location matrix is stored; and
a decoding circuit that decodes the encoded data from the set of memory cells and during decoding ignores data from the memory cells indicated by the masking array.

2. The apparatus of claim 1, wherein the test comprises one or more of a read operation, a program operation, a write operation, and a verify operation.

3. The apparatus of claim 1, wherein performing the test comprises:
performing a write operation on the set of memory cells to write test data to each memory cell of the set of memory cells;
performing a read operation on each memory cell of the set of memory cells to obtain test result data; and
indicating an error for each memory cell of the set of memory cells in which the test data written to the memory cell does not match the test result data for the memory cell.

4. The apparatus of claim 3, wherein the test data comprises one or more of user data, an inverse of the user data, and a predetermined test data pattern being written to the set of memory cells in response to the write operation.

5. The apparatus of claim 4, wherein the test data comprises user data and the user data is already stored by the set of memory cells prior to the write operation, and the write operation overwrites the already stored user data as part of the test on the set of memory cells, the set of memory cells comprising write-in-place memory cells.

6. The apparatus of claim 3, wherein the masking array is formed based on the error indication for each memory cell of the set of memory cells in which the test data written to the memory cell does not match the test result data for the memory cell.

7. The apparatus of claim 1, wherein the masking array is used to form wired erasure pointers that indicate to the decoding circuit a likelihood of erroneous data.

8. The apparatus of claim 1, wherein the masking circuit uses the masking array to mask the encoded data resulting in masked encoded data.

9. The apparatus of claim 8, wherein the decoding circuit decodes the masked encoded data.

10. The apparatus of claim 8, wherein the masking array masks the encoded data by using a logic function to set bits corresponding to the masking array to a same logic value.

11. The apparatus of claim 1, further comprising a redundancy circuit that compares a number of error bits indicated by the masking array to a minimum threshold and a maximum threshold.

12. The apparatus of claim 11, wherein the redundancy circuit accesses a redundancy storage in response to the number of error bits being greater than the maximum threshold.

13. A system comprising: a controller; and an array of storage locations, wherein the controller, in response to a failure detection circuit detecting a failure to decode undecoded data stored on the array of storage locations, is configured to: write test data to each storage location of the array of storage locations; read test result data stored on each storage location of the array of storage locations; compare the test data written to each storage location with the test result data read from each storage location; form an error location matrix based on the comparison between the test data written to each storage location and the test result data read from each storage location, wherein the error location matrix indicates storage locations in the array of storage locations having errors; store the error location matrix; and initiate performance of a decoding operation that ignores data from the storage locations indicated by the error location matrix during the decoding operation.

14. The system of claim 13, wherein the controller is configured to initiate performance of the decoding operation in response to the error location matrix indicating a number of errors greater than a minimum threshold and less than a maximum threshold.

15. The system of claim 13, wherein the error location matrix comprises hardwired erasure pointers provided to a decoder that performs a decoding operation on the undecoded data.

16. The system of claim 13, wherein the controller is configured to perform an exclusive or (XOR) operation between the error location matrix and the undecoded data, and provide a result of the XOR operation to a decoder that performs a decoding operation on the result.

17. An apparatus comprising:
means for testing operation of a memory block in response to a failure detection circuit detecting a failure to decode data of the memory block during a decoding operation;
means for determining portions of the memory block that caused the failure to decode the data of the memory block during the decoding operation;
means for storing information indicating the determined portions of the memory block that caused the failure in an error location matrix, wherein the error location matrix is determined based on a comparison between test data written to memory locations of the memory block and test result data read from each storage location, and the error location matrix indicates memory locations in the memory block having errors; and
means for decoding the data of the memory block by ignoring data from the determined portions of the memory block that caused the failure during decoding.

* * * * *